US006727683B2

United States Patent
Goto et al.

(10) Patent No.: US 6,727,683 B2
(45) Date of Patent: Apr. 27, 2004

(54) HALL-EFFECT CURRENT DETECTOR

(75) Inventors: Hirokazu Goto, Tokyo (JP); Takashi Kato, Asaka (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 10/188,693

(22) Filed: Jul. 2, 2002

(65) Prior Publication Data

US 2003/0006752 A1 Jan. 9, 2003

(30) Foreign Application Priority Data

Jul. 6, 2001 (JP) ........................................ 2001-206175

(51) Int. Cl.[7] .............................................. G01R 33/00
(52) U.S. Cl. .............................. 324/117 H; 324/117 R; 324/158.1
(58) Field of Search .............................. 324/117 H, 251, 324/362, 510, 511, 512, 560, 765, 158.1, 561

(56) References Cited

U.S. PATENT DOCUMENTS 4,059,798 A * 11/1977 Dierker et al. .............. 324/127
4,639,665 A * 1/1987 Gary ........................ 324/117 H
4,823,075 A * 4/1989 Alley ....................... 324/117 H
6,426,617 B1 * 7/2002 Haensgen et al. ......... 324/117 H
6,462,531 B1 * 10/2002 Ohtsuka .................. 324/117 H

FOREIGN PATENT DOCUMENTS

JP 4-364472 12/1992

* cited by examiner

Primary Examiner—Evan Pert
Assistant Examiner—Tung X. Nguyen
(74) Attorney, Agent, or Firm—Woodcock Washburn LLP

(57) ABSTRACT

A current detector comprising a current-path conductor in the form of a piece of sheet metal having a slit cut therein for providing a U-shaped path for the flow of current to be detected or measured. A Hall generator is held opposite the current-path conductor so as to be contained in the slit therein, as seen in a direction normal to the sheet-metal current-path conductor, for generating a Hall voltage indicative of the magnitude of the current flowing through the U-shaped current path. A magnetic overlay covers part of the current-path conductor for a higher sensitivity of current detection through enhancement of flux density acting on the Hall generator.

12 Claims, 8 Drawing Sheets

HALL-EFFECT CURRENT DETECTOR

BACKGROUND OF THE INVENTION

This invention relates to a current detector for detection or measurement of electric current flowing in an electric circuit, and more specifically to such a detector incorporating a Hall-effect device more generally known also as Hall generator.

The Hall generator is built upon the familiar Hall effect to develop a voltage, known as Hall voltage, in proportion to the strength of the magnetic field applied. Positioned contiguous to a path of electric current, the Hall generator will put out a voltage indicative of the magnitude of the current by being acted upon by the magnetic field appearing in proportion to the current magnitude.

A variety of contrivances have been suggested and incorporated with Hall-effect current detectors for enhancing the sensitivity of current detection by the Hall generators. Japanese Unexamined Patent Publication No. 4-364472 represents one such conventional effort, perhaps bearing the most pertinence to the instant invention. It teaches use of a core of high magnetic permeability embracing the current path in order to cause the magnetic lines of force due to the current flowing through the path, to act effectively upon the Hall generator.

Although capable of well achieving the objective for which it is designed, this prior art device is not totally satisfactory. The magnetic core is inconveniently bulky and expensive, adding substantively to the size and manufacturing cost of the current detector.

SUMMARY OF THE INVENTION

The present invention aims at improvement of the sensitivity of the current detector of the kind defined, without the noted shortcomings of the closest prior art.

Stated in brief, the invention concerns a current detector utilizing the Hall-effect for detection or measurement of electric current, comprising a current-path conductor for carrying current to be detected or measured, and a Hall generator disposed in prescribed positional relationship to the current-path conductor for generating a Hall voltage proportional to the strength of a magnetic field due to the current flowing through the current-path conductor. The invention particularly features a magnetic overlay in the form of a sheet or film of magnetic material covering prescribed part of the current-path conductor.

Formed on the current-path conductor to a thickness much less than that of this conductor, the magnetic overlay functions to confine the magnetic lines of force due to current flow through the current-path conductor and hence to enhance the flux density acting effectively on the Hall generator. The sensitivity of the current detector is thus improved by far more inexpensive and compact means than the conventional magnetic core.

In a representative embodiment of the invention the current-path conductor takes the form of a piece of sheet metal with a slit cut therein to provide a U-shaped path for the flow of the current to be detected or measured. Such a piece of sheet metal is easy to fabricate, as by the punching of nickel-plated sheet copper, So fabricated, the sheet-metal current-path conductor has a pair of opposite major surfaces, an inside surface contiguous to the slit, and an outside surface facing away from the slit. The Hall generator together with associated electronics is fabricated in the form of an integrated circuit, which is held opposite one of the major surfaces of the current-path conductor and, as seen in a direction normal to this conductor, contained in the slit therein. The magnetic overlay is formed on the current-path conductor, covering at least either, preferably both, of the other major surface and outside surface of the current-path conductor.

Such an overlay can be readily formed as by plating preselected part of the current-path conductor with a magnetic material such as Permalloy, by bonding a preformed sheet or film of such material, or by vaporization, pressure welding, or deposition of such material.

For still higher detection sensitivity, magnetic overlays may be formed on some additional parts of the current detector other than the current path conductor. Such additional parts include a baseplate on which is formed the integrated Hall generator circuit, and a casing enveloping the Hall generator circuit and part of the current-path conductor.

The above and other objects, features and advantages of this invention will become more apparent, and the invention itself will best be understood, from a study of the following description and appended claims, with reference had to the attached drawings showing the preferred embodiments of the invention.

DESCRIPTION OF THE PREFERRED EMBODIMENTS

General

Figure 1:
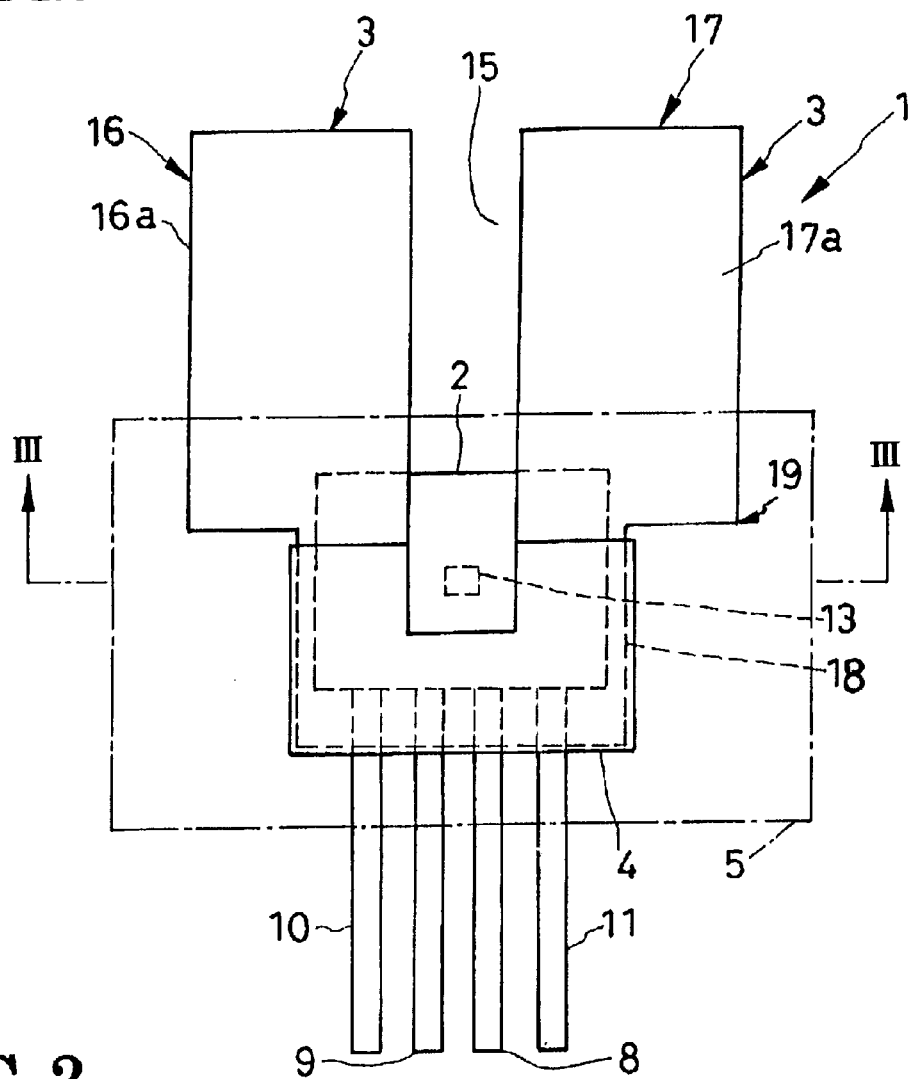
FIG. 1 is a plan view of a first preferred form of current detector according to the present invention, the view showing the casing in phantom outline to reveal other parts of the current detector.

FIGS. 1–9 of the above drawings are all directed to the first preferred form of current detector according to the invention. Pictured in its entirety and in completed form in FIGS. 1–3, the representative current detector 1 is broadly divisible as in FIG. 4 into a Hall generator assembly 2 including a Hall generator and associated electronics, and a current-path conductor 3 together with a magnetic overlay 4 covering part of the conductor. The Hall generator assembly 2 is shown by itself in FIG. 5, and the current-path conductor 3 with the magnetic overlay 4 thereon in FIG. 6. The Hall generator assembly 2 and the current-path conductor 3 are put together as in FIGS. 1–3 at a final stage of manufacture of this current detector. The current detector 1 further includes a casing 5, FIGS. 1–3, of electrically insulating material enveloping parts of the Hall generator assembly 2 and the current-path conductor 3 and integrally holding these two major components together. The Hall generator itself and the current-path conductor are in prescribed positional relationship to each other in the thus completed current conductor, as will be later discussed in more detail.

The first illustrated current detector 1 according to the invention will be set forth more specifically hereinbelow under the headings of "Hall Generator Assembly", "Current-Path Conductor" and "Magnetic Overlay". Operational description will be given following the explanation of the listed three components.

Hall Generator Assembly

Figure 3:
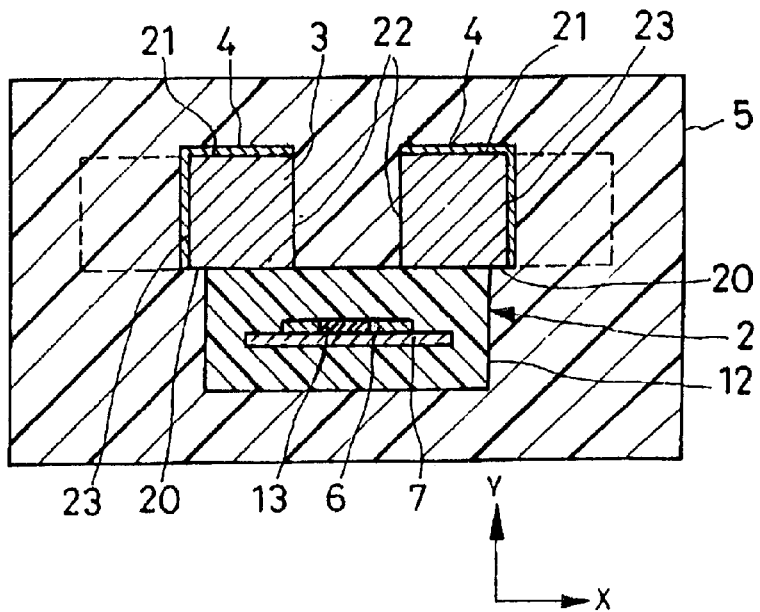
FIG. 3 is a section through the first preferred form of current detector, taken along the line III—III in FIG. 1.

The Hall generator assembly 2 is, in essence, an integrated Hall generator circuit including a semiconductor substrate 6 overlying a baseplate 7, as best revealed in FIG. 3. Additional components of the Hall generator assembly 2 include a set of leads 8, 9, 10 and 11 for connection of this current detector to external circuitry, and a plastic encapsulation 12 enveloping all the listed components of the Hall generator assembly but most parts of the leads 8–11.

Figure 7:
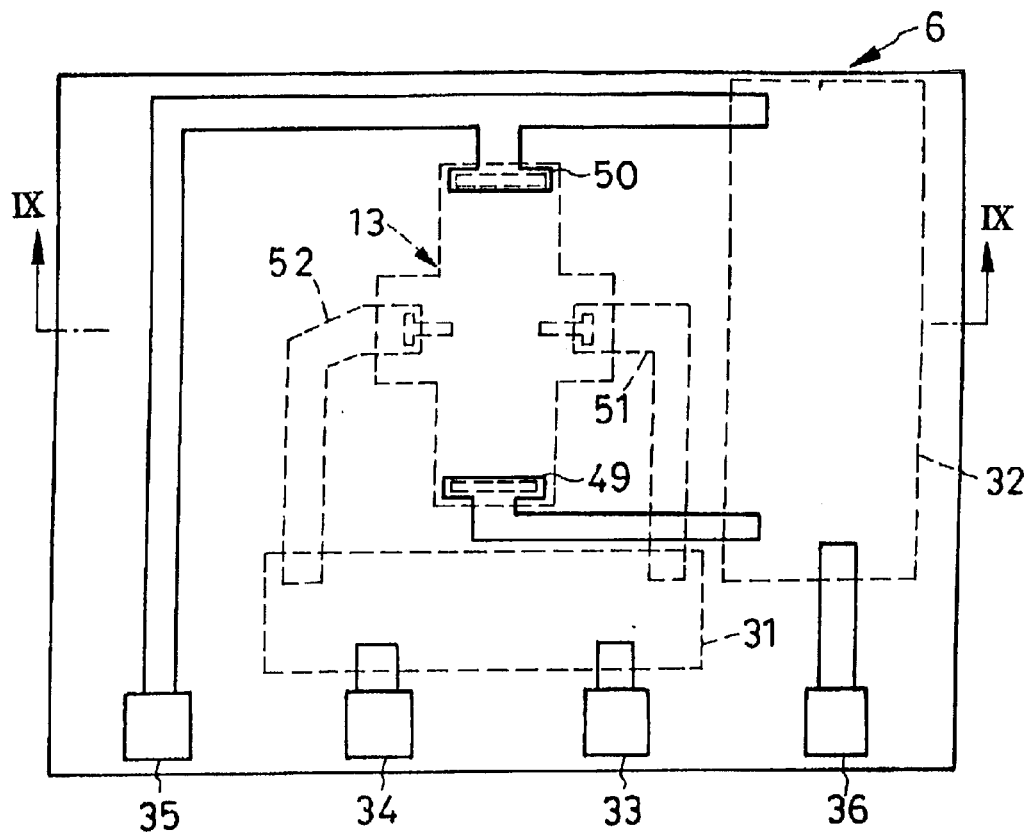
FIG. 7 is an enlarged plan view of the semiconductor device of the Hall generator assembly of the FIG. 1 current detector.

As illustrated on an enlarged scale in FIG. 7, the Hall generator assembly 2 has a Hall-effect device or Hall generator 13 formed in the semiconductor substrate 6 for generating a Hall voltage proportional to the magnitude of the current flowing through the current path conductor 3. The substrate 6 is of any known or suitable semiconductor material such as gallium arsenide. This substrate has additionally formed therein an amplifier 31, a control current supply circuit 32, and four terminals 33, 34, 35 and 36. The construction of this semiconductor chip is generally conventional, so that no more detailed illustration of the amplifier 31 and the control current supply circuit 32 is considered necessary; only, the Hall generator 13 is shown in further detail in FIGS. 8 and 9 as it bears more or less direct pertinence to the improvements that are introduced into this current detector by the instant invention.

Figure 8:
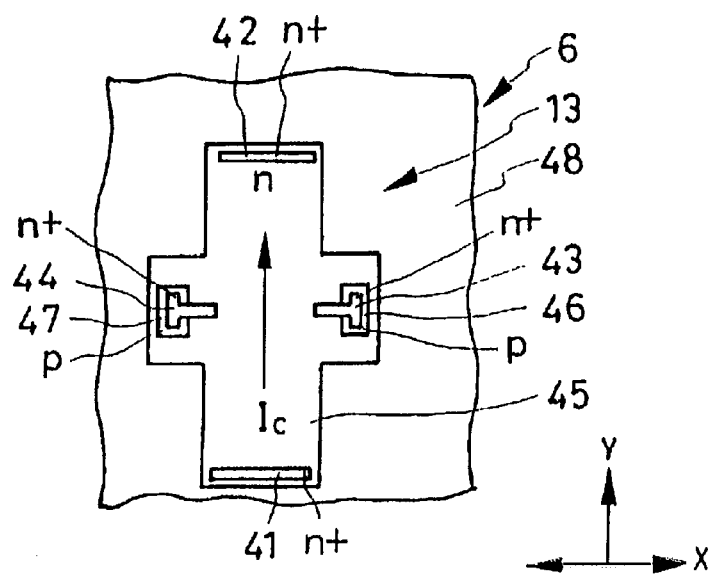
FIG. 8 is a still more enlarged, fragmentary plan view of the FIG. 7 semiconductor device, showing in particular the Hall generator included therein.
Figure 9:
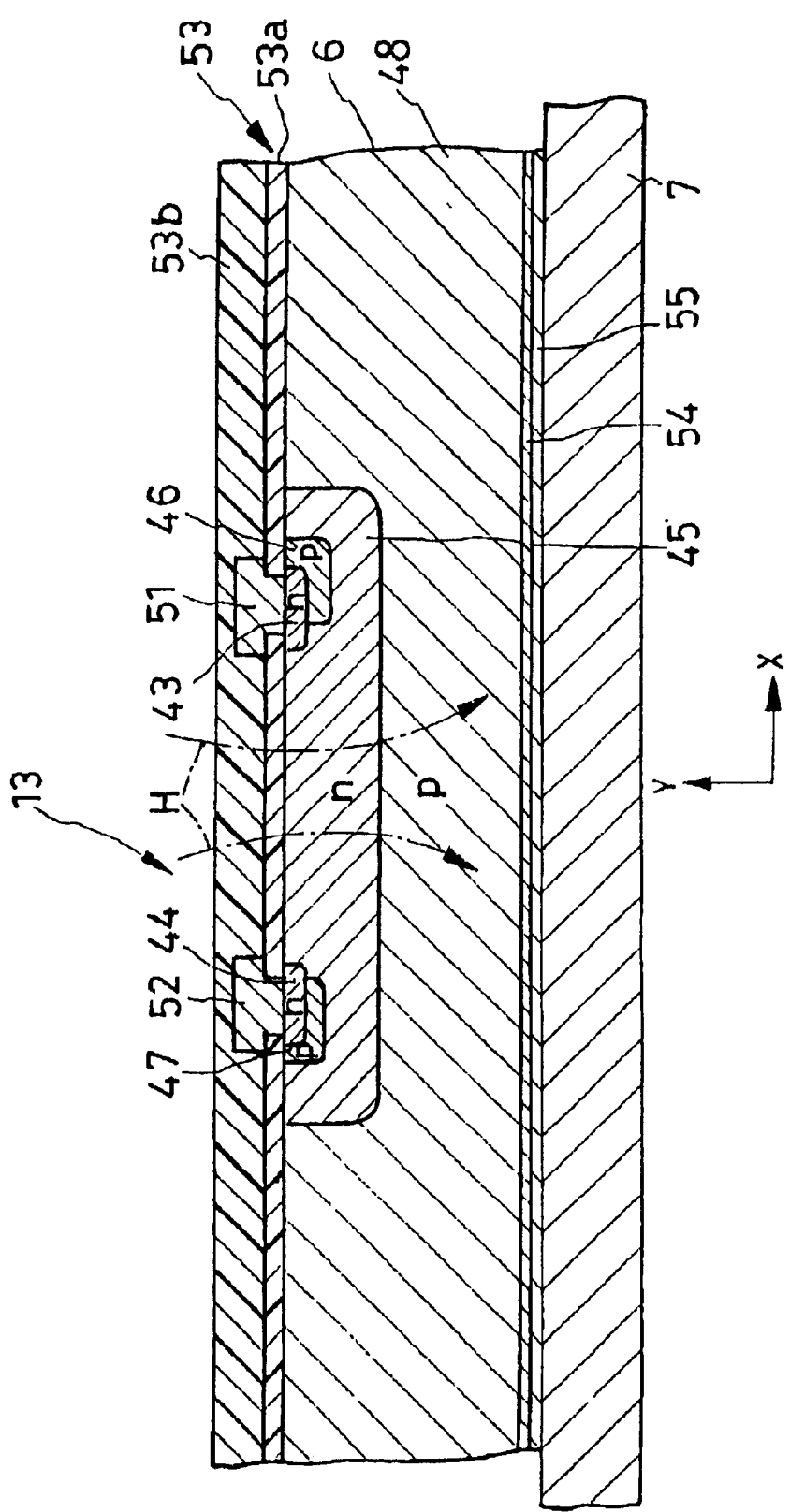
FIG. 9 is an enlarged, fragmentary section through the semiconductor device of the Hall generator assembly of the FIG. 1 current detector, taken along the line IX—IX in FIG. 7.

With reference to both FIGS. 8 and 9 the Hall generator 13 is constituted of five n-type semiconductor regions 41, 42, 43, 44 and 45 and three p-type semiconductor regions 46, 47 and 48, which are all formed in the substrate 6 of rectangular shape as seen in a plan view as in FIG. 7. The fifth n-type semiconductor region 45 is formed as an island, which is cross-shaped as seen in a plan view as in FIG. 8, in the third p-type semiconductor region 48 which occupies most part of the substrate 6. Higher in impurity concentration than this fifth n-type semiconductor region 45, the first and second n-type semiconductor regions 41 and 42 are both formed as islands in the region 45 with a spacing therebetween along the y-axis indicated in FIG. 8.

Referring temporarily back to FIG. 7, electrodes 49 and 50 are in ohmic contact respectively with the first and second n-type semiconductor regions 41 and 42. The electrodes 49 and 50 are both connected to the control current supply circuit 32 in order to cause control current $I_c$, FIG. 8, to flow through the fifth n-type semiconductor region 45 from the first n-type semiconductor region 41 to the second n-type semiconductor region 42. It is understood that the electrodes 49 and 50 are electrically connected via the control current supply circuit 32 to the pair of terminals 35 and 36, FIG. 7, thereby to be coupled to a direct current power supply, not shown.

Also higher in impurity concentration than the fifth n-type semiconductor region 45, the third and fourth n-type semiconductor regions 43 and 44 are formed adjacent the center of the fifth n-type semiconductor region in the direction of the y-axis and spaced from each other in the direction of the x-axis for detection of the Hall voltage. These regions 43 and 44 are partly contiguous to the fifth n-type semiconductor region 45 and partly to the first and second p-type semiconductor regions 46 and 47. These p-type semiconductor regions 46 and 47 are intended to limit the areas of contact of the third and fourth n-type semiconductor regions 43 and 44 with the fifth n-type semiconductor region 45. Both FIGS. 7 and 9 indicate that electrodes 51 and 52 are in ohmic contact with the third and fourth n-type semiconductor regions 43 and 44. The electrodes 51 and 52 are electrically coupled to the terminals 33 and 34, respectively, via the amplifier 31.

A Hall voltage will develop between the third and fourth n-type semiconductor regions 43 and 44 in proportion to the strength of the magnetic field applied normal to the flow of the control current $I_c$ from the first n-type semiconductor region 41 to the second n-type semiconductor region 42 as in FIG. 8. Thus the part of the fifth n-type semiconductor region 45 which lies between the first and second n-type semiconductor regions 41 and 42 and between the third and fourth n-type semiconductor regions 43 and 44 constitutes the primary working part of the Hall generator 13 where the Hall voltage is generated, in the narrower sense of the term. Speaking more broadly, however, this term may be construed to refer to the entire fifth n-type semiconductor region 45.

FIG. 9 best indicates that the semiconductor substrate 6 has an insulating layer 53, as of silicon oxide, formed on one major surface thereof and a metallic layer 54, as of aluminum, on the other major surface thereof. The insulating layer 53 takes the form of a lamination of two sublayers 53a and 53b for convenience in wiring. The electrodes 49 and 50, FIG. 7, are coupled to the first and second n-type semiconductor regions 41 and 42, respectively, via openings in these insulating sublayers 53a and 53b. The electrodes 51 and 52, FIG. 7, are coupled to the third and fourth n-type semiconductor regions 43 and 44, respectively, via openings in the insulating sublayer 53a. The metallic layer 54 on the other major surface of the substrate 6 is bonded at 55 to the mounting plate 7 shown also in FIG. 3. The bonding agent 55 may be either electrically conductive or insulating.

Figure 5:
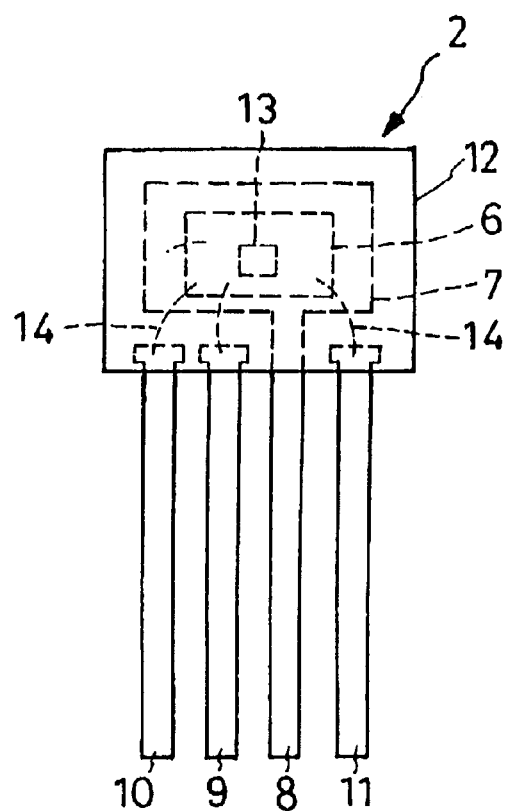
FIG. 5 is a plan view of the Hall generator assembly of the FIG. 1 current detector.

FIG. 5 best indicates that the mounting plate 7 is generally rectangular in shape, with an area greater than that of the semiconductor substrate 6. The mounting plate 7 and the four leads 8–11 are punchings made from the same sheet metal material such as sheet copper with a nickel plating. The mounting plate 7 is joined directly to the lead 8 and electrically coupled to the terminal 33, FIG. 7. The other leads 9–11 are connected to the terminals 34–36 via the wires 14, respectively. The leads 8 and 9 are for putting out the Hall voltage, and the leads 10 and 11 for supplying the control current $I_c$ to the Hall generator 13.

Current-Path Conductor

With reference to FIGS. 1–4 and 5 the current-path conductor 3 provides the path for the current to be detected by the Hall generator assembly 2. Preferably, the current-path conductor 3 is a punching of sheet copper, complete with a nickel plating, that is sufficiently thick to carry current of, say, 100 amperes or so.

Figure 6:
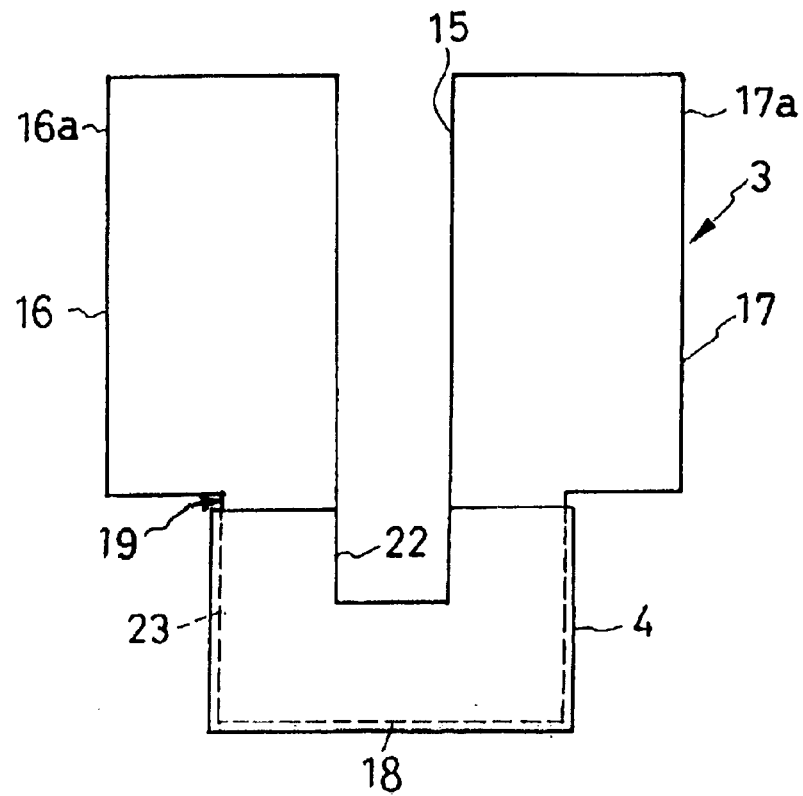
FIG. 6 is a plan view of the current-path conductor, complete with the magnetic overlay thereon, of the FIG. 1 current detector.

As best pictured in FIG. 6, the current-path conductor 3 is generally U-shaped in this particular embodiment as a relatively wide and deep slit 15 is cut therein, providing a pair of limbs 16 and 17 extending in parallel spaced relationship to each other, and a bight 18 joining the limbs each at one end thereof. The conductor limbs 16 and 17 are formed to include terminal portions $16_a$ and $17_a$ which are to be coupled to the electric circuit, not shown, to be tested.

The reference numeral 19 generally denotes the midsection of the current-path conductor 3 which is constituted of the bight 18 and the immediately adjoining parts of the limbs 16 and 17. It is this short-U-shaped midsection 19 of the current-path conductor 3 that creates the magnetic field to act on the Hall generator 13. FIG. 1 clearly indicates that, as seen in a direction normal to the plane of the sheet-metal current-path conductor 3, the Hall generator 13 is considerably less in size than, and so is wholly contained in, the space bounded by the midsection 19 of the current-path conductor.

Figure 2:
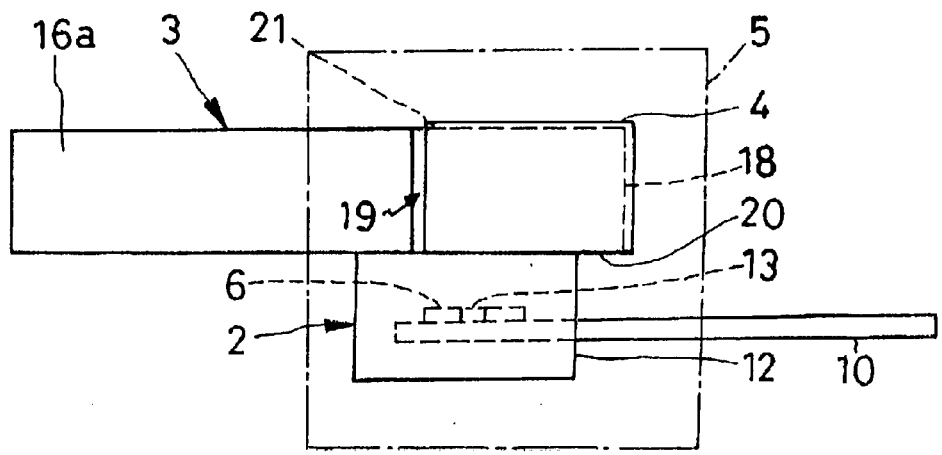
FIG. 2 is a left-hand side elevational view of the showing of FIG. 1.
Figure 4:
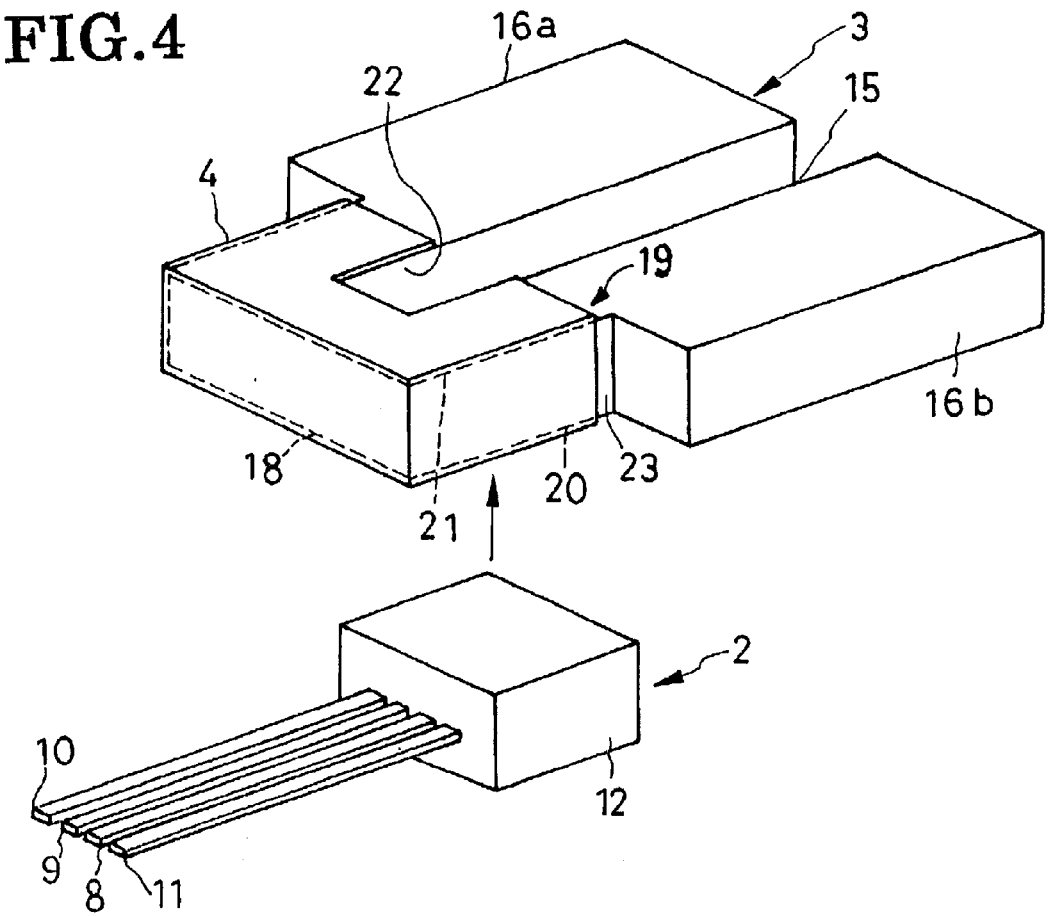
FIG. 4 is an exploded perspective view showing the FIG. 1 current detector divided into the Hall generator assembly and the current-path conductor with the magnetic overlay thereon.

As indicated in FIGS. 2–4 in particular, the short-U-shaped midsection 19 of the current-path conductor 3 has a pair of opposite major surfaces 20 and 21, a set of three inside surfaces 22, and a set of three outside surfaces 23. The inside surfaces 22 bound the deepest part of the slit 15. Both inside surfaces 22 and outside surfaces 23 are at right angles with the major surfaces 20 and 21.

Magnetic Overlay

Constituting a feature of this invention, the magnetic overlay 4 on the current-path conductor 3 appears in FIGS. 1–4 and 5. It is clear from these figures that the magnetic overlay 4 covers one major surface 21, facing away from the Hall generator assembly 2, and outside surfaces 23 of the current-path conductor midsection 19. The magnetic overlay 4 is a sheet or film of magnetic material, preferably Permalloy (tradename for a series of highly magnetically permeable iron-base alloys containing approximately 35–80% nickel). In this particular embodiment the magnetic overlay 4 has a specific magnetic permeability of 5500, which is higher than that of the ambient air or of the casing 5, and a thickness of 100 microns, which is less than that of the current-path conductor 3.

The Permalloy overlay 4 can plated on the required surfaces of the current-path conductor midsection 19. Alternatively, however, such an overlay may be created either by bonding, as with an epoxy adhesive, of a preformed sheet or film, by vaporization, pressure welding, or deposition, or by any other known or suitable method.

With the magnetic overlay 4 created as above on its required surface portions, the current-path conductor 3 is combined with the Hall generator assembly 2 by holding the plastic encapsulation 12 of the Hall generator assembly 2 against the major surface 20, left uncovered by the magnetic overlay 4, of the current path conductor midsection 19 as in FIGS. 2 and 3. The relative placement of the Hall generator assembly 2 and the current-path conductor 3 must be such that, as seen in a plan view as in FIG. 1, the Hall generator 13 is wholly contained as aforesaid inside the U-shaped midsection of the current-path conductor. This placement is necessary that the magnetic lines of force created upon current flow through the current-path conductor 3 may act at least in part perpendicular to the surface of the Hall generator 13.

After being put together as in the foregoing, the Hall generator assembly 2 and the current-path conductor 3 with the magnetic overlay 4 thereon are both partly enveloped by the casing 5 of epoxy resin or like electrically insulating material molded in place thereon. The pair of terminals $16_a$ and $16_a$ of the current-path conductor 3, and most parts of the leads 8–11 are left projecting from the casing 5.

Operation

In use of this current detector 1, constructed as set forth herein-before with reference to FIGS. 1–9, the pair of terminals $16_a$ and $17_a$ of the current-path conductor 3 may be connected to the electric circuit to be tested, so that the current to be detected or measured may flow through the U-shaped path of the conductor. Let it be assumed that the current flows from terminal $17_a$ to terminal $16_a$. The current flow will create magnetic lines of force in a clockwise direction, as seen in FIG. 3, around the current-path conductor limb 16 and in a counterclockwise direction around the other limb 17. These magnetic lines will therefore act on the Hall generator 13 in the same direction. It will also be apparent that the magnetic lines due to current flow through the bight 18 of the current-path conductor 3 act on the Hall generator 13 in the same direction as do the magnetic lines due to current flow through the current-path conductor limbs 16 and 17. Substantially encircled and closely adjoined by the current-path conductor midsection 19, the primary working part of the Hall generator 13 will be effectively acted upon by all such magnetic lines.

It is essential for utmost sensitivity that the as many as possible of the magnetic lines, created around the current path upon current flow therethrough, act effectively upon the primary working part of the Hall generator 13. The magnetic overlay 4 according to the invention is designed exactly to this end. As will be recalled by reference to FIG. 3, the magnetic overlay 4 covers the major surface 21 and outer surfaces 23, which are both relatively far, and are directed away, from the Hall generator 13, but not the other major surface 20 and the inside surfaces 22, which are both closer to, and are directed toward, the Hall generator. Being higher in magnetic permeability than air and the casing 5, the magnetic overlay 4 functions as a low resistance path for the magnetic flux, preventing the magnetic lines from dispersion and so keeping the flux density higher than if it were not provided.

The following is a summary of the features of the FIGS. 1–9 current detector 1 as well as the advantages accruing therefrom:

1. The short-U-shaped midsection 19 of the current-path conductor 3 is partly covered by the magnetic overlay 4 which is much thinner than the sheet-metal current-path conductor. The sensitivity of the current detector is materially enhanced by this simple, compact and inexpensive means.

2. The current-path conductor midsection 19 encircles as much as 75 percent of the Hall generator 13 as seen in a direction normal to the current-path conductor, again resulting in higher sensitivity through an increase in the magnetic lines acting on the Hall generator.

3. The Hall generator assembly 2 and the current-path conductor 3, with the magnetic overlay 4 on the latter, are closely and rigidly held together by the epoxy casing 5, so that the current-path conductor and the Hall generator 13 are to be maintained in the required positional relationship for accurate current detection and measurement throughout the useful life of the device.

Figure 10:
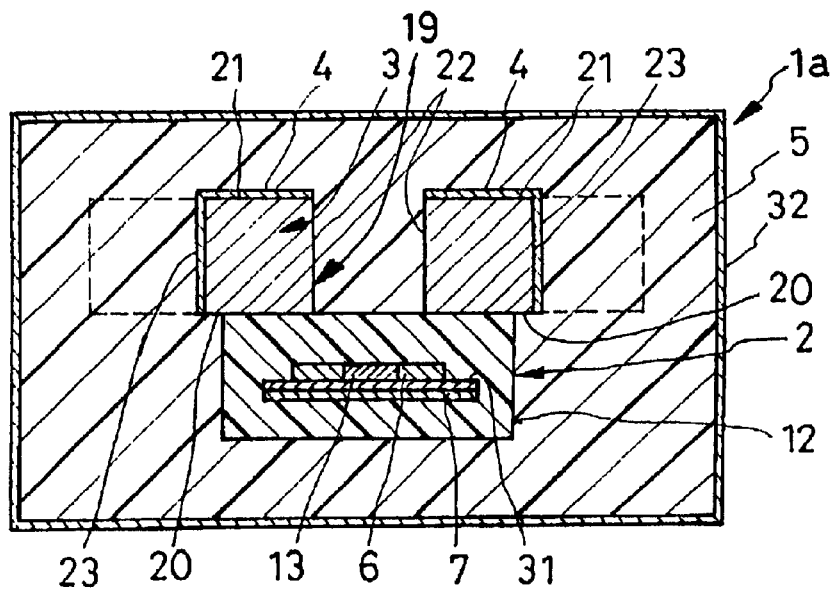
FIG. 10 is a sectional view similar to FIG. 3 but showing another preferred form of current detector according to the invention.

Embodiment of FIG. 10

This second preferred form of current detector $1_a$ according to the invention features a second magnetic overlay 31 and a third magnetic overlay 32 in addition to the first magnetic overlay 4 covering part of the current-path conductor 3 as in the FIGS. 1–9 current detector 1. The second magnetic overlay 31 overlies one major surface of the baseplate 7, and the semiconductor chip 6 including the Hall generator and associated electronics is mounted to this baseplate via the second magnetic overlay 31. The third magnetic overlay 32 covers the complete surfaces of the insulating casing 5 except where it might contact the pair of terminal portions $16_a$ and $17_a$, FIG. 1, of the current-path conductor 3 and the set of leads 8–11.

In practice both second and third magnetic overlays 31 and 32 may be of Permalloy with a specific magnetic permeability of 5500 and a thickness of 100 microns. Such overlays may be either bonded to the required surfaces or may be created in place thereon by any available methods. The additional magnetic overlays 31 and 32 will serve further to heighten the sensitivity of the current detector by lessen the dispersion of the magnetic lines.

Figure 11:
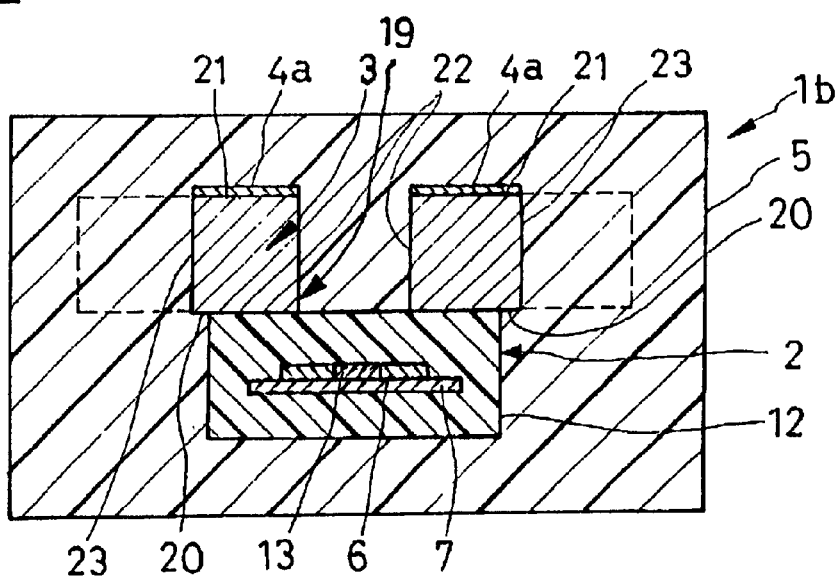
FIG. 11 is also a sectional view similar to FIG. 3 but showing still another preferred form of current detector according to the invention.

Embodiment of FIG. 11

The FIG. 11 current detector 1b differs from the foregoing devices 1 and $1_a$ in having a magnetic overlay $4_a$ covering only the major surface 21, which faces away from the Hall generator assembly 2, of the short-U-shaped midsection 19 of the current-path conductor 3. All the other details of construction are as set forth above in connection with the FIGS. 1–9 current detector 1.

Covering only the major surface 21 of the current-path conductor midsection 19, the magnetic overlay $4_a$ has proved to work for higher sensitivity by limiting the dispersion of the magnetic lines in a direction away from the Hall generator assembly 2.

Figure 12:
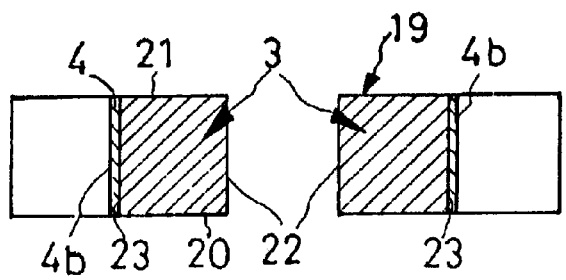
FIG. 12 is a partial sectional view somewhat similar to FIG. 3 but showing yet another preferred form of current detector according to the invention.

Embodiment of FIG. 12

The current-path conductor midsection 19 may have only its outer surfaces 23 covered with a magnetic overlay, as indicated at $4_b$ in FIG. 12. Such an overlay $4_b$ will also lead to some appreciable improvement in sensitivity as it restricts outward spreading of the magnetic lines.

Figure 13:
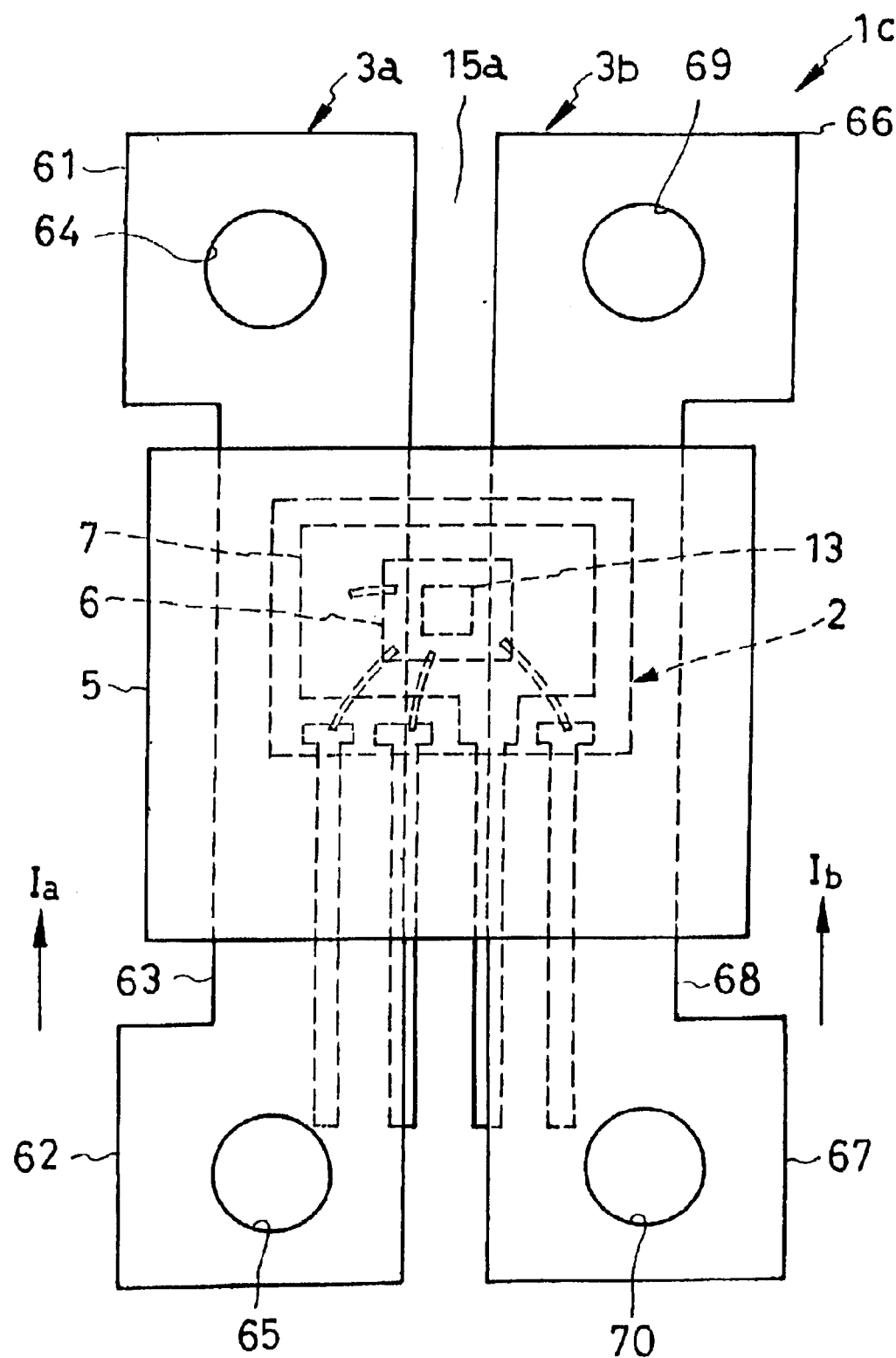
FIG. 13 is a plan view of a further preferred form of current detector according to the invention.
Figure 14:
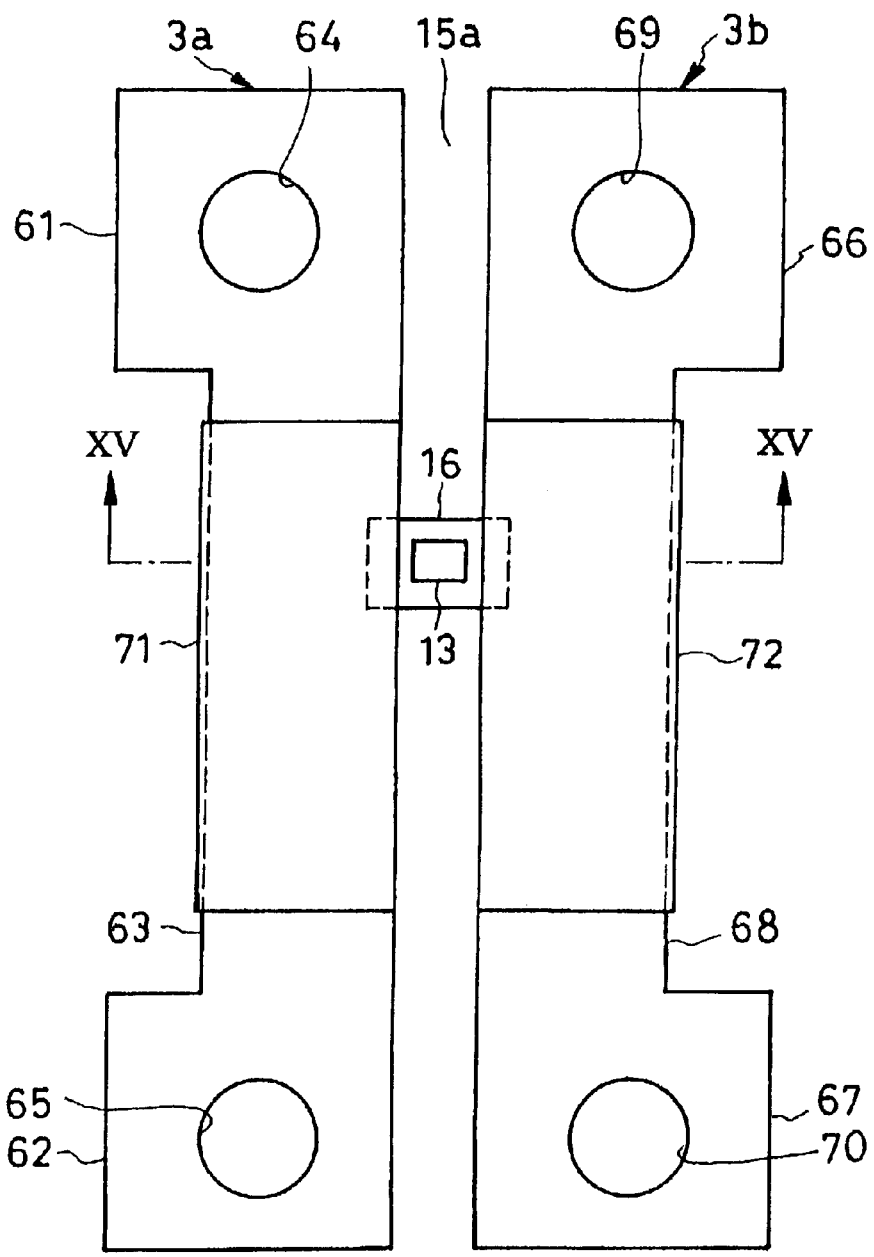
FIG. 14 is a plan view showing the pair of current-path conductors and Hall generator of the FIG. 13 current detector in prescribed relative positions.
Figure 15:
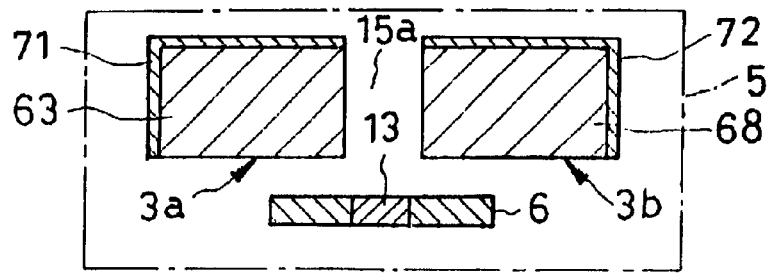
FIG. 15 is a section through the showing of FIG. 14, taken along the line XV—XV therein.

Embodiment of FIGS. 13–15

In FIG. 13 is shown a further preferred form of current detector $1_c$ according to the invention which is adapted for detection of current leakage, among other purposes. The current detector $1_c$ has a pair of elongate sheet-metal current-path conductors $3_a$ and $3_b$ in place of the unitary U-shaped current-path conductor 3 of the FIGS. 1–9 current detector 1. The pair of current-path conductors $3_a$ and $3_b$ are combined by an epoxy casing 5 with the Hall generator assembly 2 of the same construction as in FIGS. 1–9. Encircling parts of the current-path conductors $3_a$ and $3_b$ and most part of the Hall generator assembly 2, the epoxy casing 5 rigidly holds the current-path conductors in prescribed positional relationship to each other and to the Hall generator 13.

As better illustrated in FIG. 14, the pair of current-path conductors $3_a$ and $3_b$ are held by the casing 5, not shown here, parallel to each other with a spacing $15_a$ therebetween. This spacing may be considered functionally equivalent to the slit 15 of the FIGS. 1–9 current-path conductor 3, as the Hall generator 13 is wholly contained in this space as seen in a plan view as in FIG. 14. The current-path conductor $3_a$ has a pair of terminal sections 61 and 62, with connection holes 64 and 65 cut centrally therein, and a midsection 63 between the terminal sections. The other current-path conductor $3_b$ likewise comprises a pair of terminal sections 66 and 67, with connection holes 69 and 70 cut centrally therein, and a midsection 68 between these terminal sections. The current-path conductor midsections 63 and 68 are partly covered with overlays 71 and 72, respectively, of Permalloy or like magnetic material.

As clearly pictured in FIG. 15, which is a section taken along XV—XV in FIG. 14, the magnetic overlays 71 and 72 are in essentially the same positional relationship to the Hall generator 13. The magnetic overlay 71 covers only those two surfaces of the current-path conductor midsection 63, which is rectangular in cross sectional shape, which face away from the Hall generator 13. Similarly, the other magnetic overlay 72 covers only those two surfaces of the current-path conductor midsection 68 of similar cross sectional shape which face away from the Hall generator 13. Thus the current detector $1_c$, offers the same advantages as does the FIGS. 1–9 device 1.

In use of the FIGS. 13–15 device $1_c$ as a current leakage detector, the pair of current-path conductors $3_a$ and $3_b$ may be serially connected respectively to the pair of power conductors to be tested, not shown, in such a way that the currents $I_a$ and $I_b$ may flow in the same direction through the conductors $3_a$ and $3_b$, as indicated by the arrows in FIG. 13. The currents $I_a$ and $I_b$ will be of the same magnitude if there is no leakage. The Hall generator 35 will produce no voltage when the currents $I_a$ and $I_b$ are of the same magnitude, since the magnetic fluxes due to the currents $I_a$ and $I_b$ act on the Hall generator in opposite directions. In event a current leakage does occur, however, the currents $I_a$ and $I_b$ will be unequal in magnitude, so that the Hall generator 35 will put out a voltage in proportion with the magnitude of the leaking current.

The FIGS. 13–15 embodiment lends itself to use as a current balance detector as well. The Hall voltage proportional to the difference between the magnitudes of two currents to be measured will be produced as such currents are made to flow through the pair of current path conductors $3_a$ and $3_b$. Still further the FIGS. 13–15 current detector $1_c$ is readily adaptable for use in the same manner as the FIGS. 1–9 device 1 as the pair of current-path conductors $3_a$ and $3_b$ provide the U-shaped current path as its terminal sections 62 and 67, for instance, are electrically interconnected.

Possible Modifications

Although the current detector according to the invention has been shown and described hereinbefore in terms of several preferred forms thereof, it is not desired that the present invention be limited by the exact details of the drawings or by the description thereof. The following is a brief list of possible modifications and alterations of the illustrated embodiments which are all believed to fall within the scope of this invention:

1. The magnetic overlays $4_a$ and $4_b$ of FIGS. 11 and 12 could be combined with either or both of the magnetic overlays 31 and 32 of FIG. 10.
2. The Hall generator 13 could be positioned flush with the current-path conductor 3, or $3_a$ and $3_b$.
3. The short-U-shaped midsection 19 of the current-path conductor 3 could take other shapes such as those of the letters I, L or U.
4. The magnetic overlay 31, FIG. 10, could be formed on the other surface of the baseplate 7 which faces away from the Hall generator 13.
5. In the FIGS. 13–15 current detector IC, as in FIGS. 1–9 current detector 1, only either of those two surfaces of each current-path conductor midsection 63 or 68 which face away from the Hall generator 13.

What is claimed is:

1. A current detector utilizing the Hall-effect for detection or measurement of electric current, comprising:
    (a) a current-path conductor for carrying current to be detected or measured;
    (b) a Hall generator disposed in prescribed positional relationship to the current-path conductor for generating a Hall voltage proportional to the strength of a magnetic field due to the current flowing through the current-path conductor; and
    (c) a magnetic overlay in the form of a sheet or film of magnetic material covering part of the current-path conductor for a higher sensitivity of current detection through enhancement of flux density acting on the Hall generator.

2. The current detector of claim 1 wherein the current-path conductor is formed to include a pair of opposite terminal portions and a midsection therebetween, wherein the Hall generator is so positioned relative to the current-path conductor as to be acted upon by a magnetic field due to the current flowing through the midsection of the current-path conductor, and wherein the magnetic overlay covers at least part of the midsection of the current-path conductor.

3. The current detector of claim 2 wherein the midsection of the current-path conductor extends around the Hall generator in a plane not containing the Hall generator, wherein the midsection of the current-path conductor is rectangular in cross sectional shape, having a first major surface directed toward the Hall generator, a second major surface directed away from the Hall generator, an inside surface directed toward the Hall generator, and an outside surface directed away from the Hall generator, and wherein the magnetic overlay covers the second major surface of the current-path conductor.

4. The current detector of claim 2 wherein the midsection of the current-path conductor extends around the Hall generator in a plane not containing the Hall generator, wherein the midsection of the current-path conductor is rectangular in cross sectional shape, having a first major surface directed toward the Hall generator, a second major surface directed away from the Hall generator, an inside surface directed toward the Hall generator, and an outside surface directed away from the Hall generator, and wherein the magnetic overlay covers the outside surface of the current-path conductor.

5. The current detector of claim 2 wherein the midsection of the current-path conductor extends around the Hall generator in a plane not containing the Hall generator, wherein the midsection of the current-path conductor is rectangular in cross sectional shape, having a first major surface directed toward the Hall generator, a second major surface directed away from the Hall generator, an inside surface directed toward the Hall generator, and an outside surface directed away from the Hall generator, and wherein the magnetic overlay covers both second major surface and outside surface of the current-path conductor.

6. The current detector of claim 2 wherein the Hall generator is formed in a semiconductor substrate having a first major surface directed toward the current-path conductor, and a second major surface directed away from the current-path conductor, and wherein the current detector has a second magnetic overlay held against the second major surface of the semiconductor substrate.

7. The current detector of claim 1 further comprising:
    (a) a casing of electrically insulating material enveloping the Hall generator and at least part of the current-path conductor with the magnetic overlay thereon; and
    (b) a second magnetic overlay covering part of the casing.

8. The current detector of claim 1 wherein the magnetic overlay is of Permalloy.

9. A current detector utilizing the Hall-effect for detection or measurement of electric current, comprising:
    (a) a current-path conductor in the form of a piece of sheet metal having a slit cut therein for providing a U-shaped path for the flow of current to be detected or measured, the sheet-metal current-path conductor having a pair of opposite major surfaces, an inside surface contiguous to the slit, and an outside surface facing away from the slit;
    (b) a Hall generator for generating a Hall voltage proportional to the strength of an applied magnetic field;
    (c) an encapsulation of electrically insulating material integrally enveloping the Hall generator and held against one of the major surfaces of the current-path conductor, with the Hall generator positioned inside the slit therein, as seen in a direction normal to the sheet-metal current-path conductor, for generating a Hall voltage indicative of the magnitude of the current flowing through the U-shaped current path; and
    (d) a magnetic overlay in the form of a sheet or film of magnetic material covering at least either of the other major surface and outside surface of the current-path conductor for a higher sensitivity of current detection through enhancement of flux density acting on the Hall generator.

10. The current detector of claim 9 wherein the Hall generator is formed in a semiconductor substrate overlying a baseplate, and wherein the current detector further comprises a second magnetic overlay formed on the baseplate.

11. The current detector of claim 9 further comprising
    (a) a casing of electrically insulating material enveloping the encapsulation, together with the Hall generator therein, and at least part of the current-path conductor together with the magnetic overlay thereon; and
    (b) a second magnetic overlay covering at least part of the casing.

12. A current detector utilizing the Hall-effect for detection or measurement of electric current, comprising:
    (a) a pair of current-path conductors each in the form of an elongate piece of sheet metal for carrying current to be detected or measured, the pair of current-path conductors extending in parallel spaced, coplanar relationship to each other, each sheet-metal current-path conductor having a pair of opposite major surfaces, an inside surface directed toward the other current-path conductor, and an outside surface directed away from the other current-path conductor;

(b) a Hall generator for generating a Hall voltage proportional to a difference between the magnitudes of currents flowing through the respective current-path conductors;

(c) a casing of electrically insulating material holding the Hall generator opposite the pair of current-path conductors and inside the space therebetween, as seen in a direction normal to the plane of the sheet-metal current-path conductors, the Hall generator being directed toward one of the major surfaces of each current-path conductor; and (d) a magnetic overlay in the form of a sheet or film of magnetic material covering at least either of the other major surface and outside surface of each current-path conductor for a higher sensitivity of current detection through enhancement of flux density acting on the Hall generator.

* * * * *

UNITED STATES PATENT AND TRADEMARK OFFICE
CERTIFICATE OF CORRECTION

PATENT NO.   : 6,727,683 B2
DATED        : April 27, 2004
INVENTOR(S)  : Hirokazu Goto and Takashi Kato It is certified that error appears in the above-identified patent and that said Letters Patent is hereby corrected as shown below:

Column 1,
Line 63, delete "copper," and insert -- copper. -- therefor;

Column 2,
Line 8, insert -- the -- after "plating";

Column 5,
Line 62, insert -- be -- after "can";

Column 6,
Line 21, delete "$16_a$" and insert -- $17_a$ -- therefor;
Line 45, delete "the";

Column 7,
Line 39, delete "lessen" and insert --lessening -- therefor;

Column 8,
Line 49, insert -- the -- after "In";

Column 9,
Line 18, delete "IC" and insert -- $1_c$ -- therefor;

Column 10,
Line 56, insert -- : -- after "comprising".

Signed and Sealed this

Fourteenth Day of December, 2004

JON W. DUDAS
*Director of the United States Patent and Trademark Office*